(12) United States Patent
Ohmori

(10) Patent No.: US 6,492,718 B2
(45) Date of Patent: Dec. 10, 2002

(54) STACKED SEMICONDUCTOR DEVICE AND SEMICONDUCTOR SYSTEM

(75) Inventor: Jun Ohmori, Yokkaichi (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/739,256

(22) Filed: Dec. 19, 2000

(65) Prior Publication Data

US 2001/0023980 A1 Sep. 27, 2001

(30) Foreign Application Priority Data

Dec. 20, 1999 (JP) .......................................... 11-361059

(51) Int. Cl.[7] .............................................. H01L 23/02
(52) U.S. Cl. ...................... 257/686; 257/688; 257/689; 257/685; 257/785; 257/723; 257/724; 257/774
(58) Field of Search ................................. 257/686, 688, 257/689, 685, 785, 723, 724, 774

(56) References Cited

U.S. PATENT DOCUMENTS 5,579,207 A * 11/1996 Hayden et al. ............. 361/790
6,054,774 A    4/2000 Ohmori et al.
6,147,411 A * 11/2000 Kinsman ..................... 257/777

FOREIGN PATENT DOCUMENTS

| JP | 9-219490 | 8/1997 |
|---|---|---|
| JP | 10-135267 | 5/1998 |
| JP | 10-163414 | 6/1998 |

* cited by examiner

*Primary Examiner*—Kamand Cuneo
*Assistant Examiner*—Luan Thai
(74) *Attorney, Agent, or Firm*—Oblon, Spivak, McClelland, Maier & Neustadt, P.C.

(57) ABSTRACT

A stacked semiconductor device includes a plurality of stacked wiring substrates each having connection electrodes and wires connected to the connection electrodes and each mounted with a semiconductor device, a plurality of conductive via boards each interposed between adjacent two wiring substrates and having an opening for enclosing the semiconductor device, an uppermost wiring substrate formed on the top of the stacked wiring substrates and having wires connected to the connection electrodes, and a lowermost wiring substrate formed under the stacked wiring substrates and having wires connected to the connection electrodes, wherein heat radiation/shield conductive layers are formed on the uppermost and lowermost wiring substrates.

19 Claims, 6 Drawing Sheets

STACKED SEMICONDUCTOR DEVICE AND SEMICONDUCTOR SYSTEM

CROSS-REFERENCE TO RELATED APPLICATIONS

This application is based upon and claims the benefit of priority from the prior Japanese Patent Application No. 11-361059, filed Dec. 20, 1999, the entire contents of which are incorporated herein by reference.

BACKGROUND OF THE INVENTION

The present invention relates to a stacked semiconductor device in which a plurality of wiring substrates each mounted with a semiconductor device are stacked to constitute a package and a semiconductor system in which the stacked semiconductor device is loaded.

For the purpose of attaining high packed density of semiconductor devices, a plurality of wiring substrates each mounted with a semiconductor device are often stacked one on another to constitute a stacked package. A conventional stacked package is constituted as disclosed in, for example, Jpn. Pat. Appln. KOKAI Publications Nos. 9-219490, 10-135267 and 10-163414.

The conventional package is constituted as follows. First, individual packages such as a TSOP (thin small outline package), a TCP (tape carrier package) and a BGA (ball grid array) are each assembled completely. Then, the respective packages are stacked one on another through spacers with external terminals thereof being faced one another. These packages are thus formed integrally as a single stacked package. Finally, they are electrically connected to one another.

The conventional stacked package described above necessitates a processing step of stacking the individual packages in addition to a step of assembling the individual packages. Such a stacked package is manufactured by a sequential method in which the number of steps increases by the number of packages. This method causes serious problems of increasing manufacturing cost and materials cost of spacers used for stacking a plurality of packages. FIGS. 12A to 13B illustrate a conventional stacked-type semiconductor device. Individual packages 104 and 106 each mounted with a semiconductor device, such as a TSOP, a TCP and a BGA, are assembled completely. These packages 104 and 106 are then soldered to a wiring substrate or module substrate 103 such as a printed board to complete a module. In the individual package 104 such as a TSOP, for example, an external terminal 105 of the semiconductor device is soldered to a metal wiring on the module substrate 103, and the substrate 103 is attached to an external device 110 constituted of a semiconductor system comprising semiconductor devices. In the case of FIG. 13B, the individual package 103 is mounted and connected on the substrate 103 by means of solder balls 107.

The external device 110 includes a spring terminal 101 made of a flat spring plate mounted on a substrate 100 which is further mounted on a base 102. The module substrate 103 is fitted to the external device 110 such that a connection terminal 108 of the substrate 103 contacts the spring terminals 101 of the external device 110.

The above example, however, has the problem that a soldering portion deteriorates as time passes due to a difference in thermal expansion coefficient between the package 104 or 106 and the module substrate 103. The connection terminal 108 is provided on the surface of the substrate 103 except where the package 104 or 106 is mounted, so that the entire module includes a package mounting section and a connection terminal section. It is thus too large as a module of a portable storage medium for use in small-sized personal computers, portable terminals, and voice recorders.

Once a module is mounted on a system, melting solder of a connecting portion by heat and replacing the module with another module is required, which is like to cause poor connection. In the prior art structure, it is impossible to remove only a desired module from the system and insert another therein.

The foregoing prior art semiconductor device has the problem that it does not produce an electric field shielding effect sufficiently.

As a semiconductor device increases in density and decreases in thickness and is used widely in IC cards and cellular phones, for example, a thin stacked package which is suitable for a semiconductor chip having a thickness of about 30 $\mu$m to 200 $\mu$m will be required in the future.

The present invention has been developed in consideration of the above situation and its object is to provide a stacked semiconductor device which is thin, high in heat radiation, excellent in shield effect and easy to attach/detach to/from an external system, and a semiconductor system mounted with the stacked semiconductor devices.

BRIEF SUMMARY OF THE INVENTION

A stacked semiconductor device according to one aspect of the present invention comprises a plurality of stacked wiring substrates each including a plurality of via-holes in which connection electrodes are buried and wires electrically connected to the connection electrodes, an uppermost wiring substrate stacked on a top of the stacked wiring substrates and including a plurality of via-holes in which connection electrodes are formed and wires electrically connected to the connection electrodes, a semiconductor device mounted on each of the wiring substrates and electrically connected to the wires thereof, a plurality of conductive via insulation substrates each having a chip cavity which is larger than the semiconductor device enclosed therein and each including a plurality of via-holes in which connection electrodes are buried, each of the conductive via insulation substrates being inserted between two wiring substrates, and a plurality of conductive layers formed on a top surface of the uppermost wiring substrate and/or a bottom surface of a lowermost wiring substrate formed under the stacked wiring substrates, wherein the wiring substrates, the uppermost wiring substrate, and the conductive via insulation substrates are electrically connected to each other by the connection electrodes.

The conductive layers can be used as external connection terminals. Each of the external connection terminals may have a diameter of 1 mm or more and an area of 1 mm$^2$ or larger.

At least one of the connection electrodes of the wiring substrates, the uppermost wiring substrate, and the conductive via insulation substrates can be connected to a ground line, and at least one of the conductive layers can electrically be connected to the ground line through the connection electrodes. At least one of the conductive layers may serve as a heat radiation layer. The area of the conductive layers occupying one of the uppermost wiring substrate and the lowermost wiring substrate may range from 50% to 95% of the whole surface area of the uppermost or lowermost wiring substrate. The via-holes of the wiring substrates, the uppermost wiring substrate, and the conductive via insulation substrates can be exposed to sides of the substrates, in such a manner that the connection electrodes buried in the via-holes are exposed to side walls of the substrates. The connection electrodes exposed to the side walls of the substrates may serve as external connection terminals. The semiconductor device may have a thickness of 30 μm to 200 μm.

The plurality of conductive layers formed on the top surface of the uppermost wiring substrate and the underside of the lowermost wiring substrate are used as heat radiation layers, external connection terminals and shield layers. When the conductive layers are used as external connection terminals, they are connected to the connection electrodes connected to a signal line in the package. When the conductive layers are used as shield layers, they are connected to a ground line. The shield layers and the external connection terminals can be arranged on one of the uppermost or undermost wiring substrate, and the shield layers and the external connection terminals can be used also as the heat radiation layers. The conductive layers can be used only as the heat radiation layers.

A semiconductor system according to another aspect of the present invention comprises external connection terminals of the semiconductor device including spring terminals made of flat spring plates. The plurality of conductive layers are formed on the top surface and/or the bottom surface of the uppermost or lowermost wiring substrates. A stacked semiconductor device of the present invention, which is thin, high in heat radiation, excellent in shield effect, and easy to attach/detach to/from the external device, can thus be attained, and so can be mounted to a semiconductor system easily.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will now be described with reference to the accompanying drawings.

A stacked semiconductor device according to a first embodiment of the present invention,;which is constituted as a stacked package, will be. described first with reference to FIGS. 1A to 3 and 7.

Figure 1A:
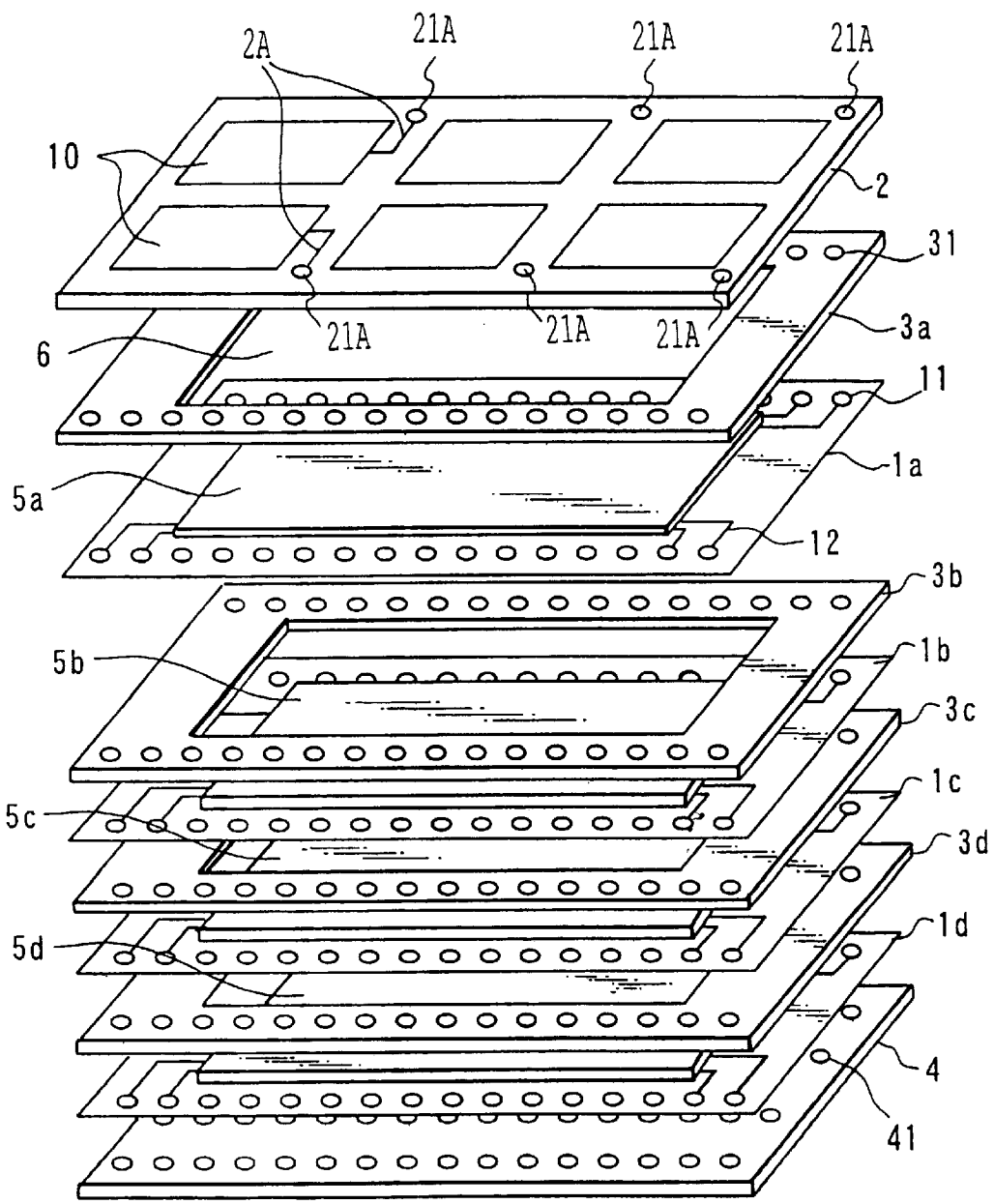
FIG. 1A is a perspective view of a disassembled semiconductor device according to a first embodiment of the present invention, which is constituted as a stacked package including uppermost and lowermost wiring substrates
Figure 1B:
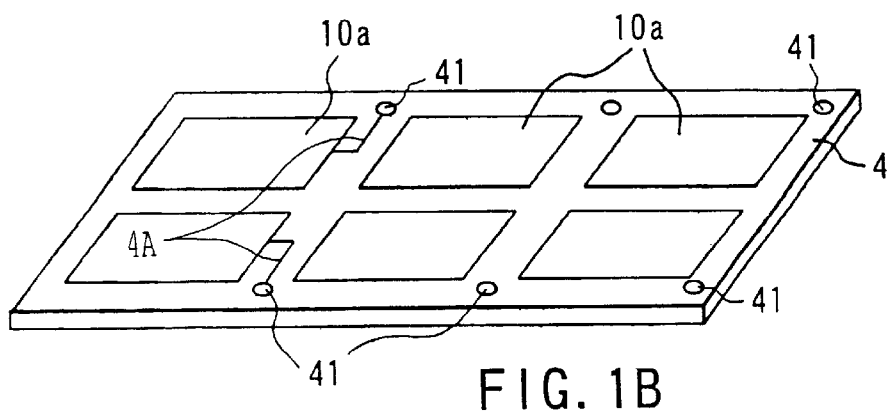
FIG. 1B is a perspective view of external terminals of the lowermost wiring substrate of the semiconductor device shown in FIG. 1A.
Figure 2:
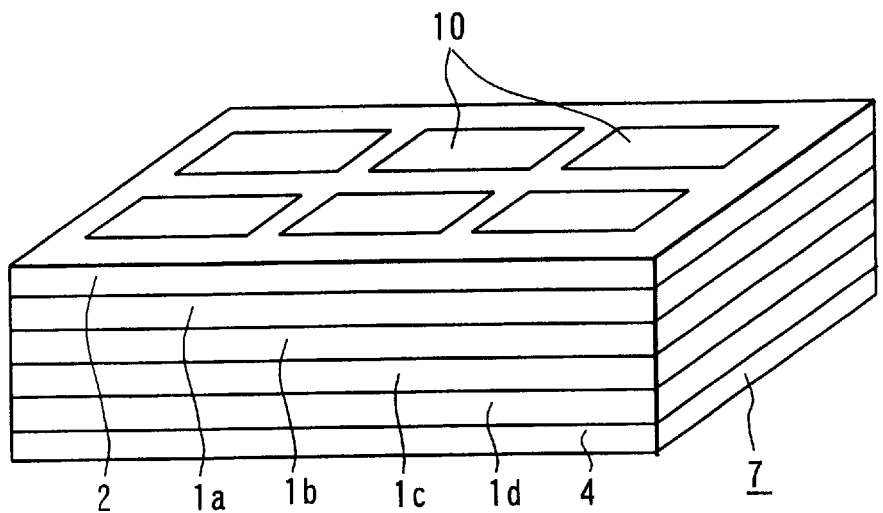
FIG. 2 is perspective view of the stacked package of semiconductor device shown in FIG. 1A.
Figure 3:
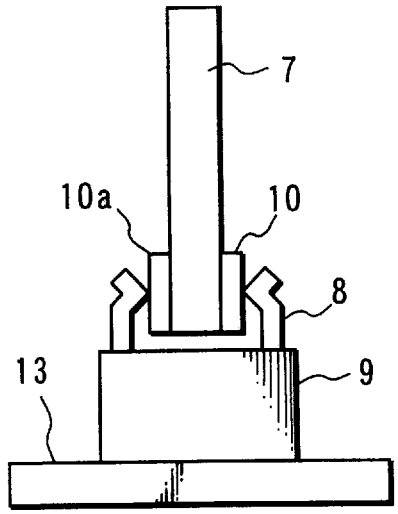
FIG. 3 is a side view of a semiconductor system on which the staked package of the semiconductor device according to FIGS. 1A, 1B and 2 is mounted.
Figure 7:
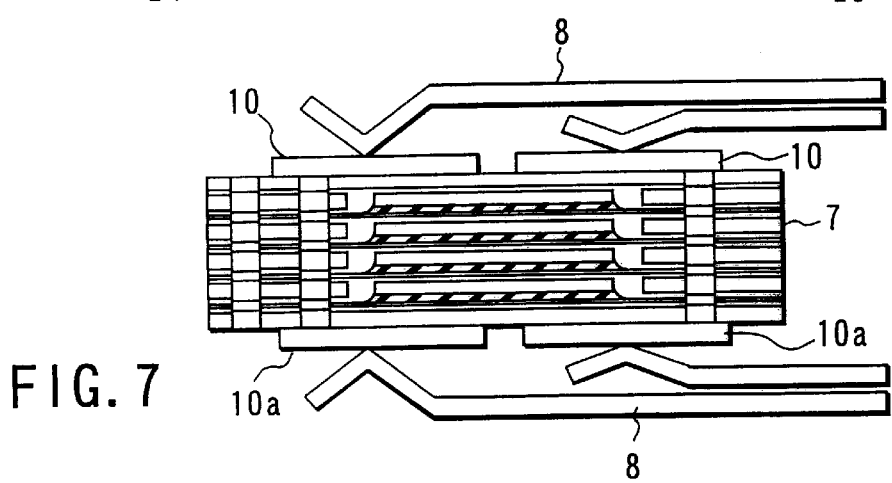
FIG. 7 an enlarged cross-sectional view of a part of the semiconductor system shown in FIG. 3.

FIG. 1A is a perspective view of the: disassembled stacked package, FIG. 1B is a perspective view of external terminals of the lowermost wiring substrate of the stacked package, FIG. 2 is a perspective view of the assembled stacked package of FIG. 1A, FIG. 3 is a side view of a semiconductor system on which the stacked package is mounted, and FIG. 7 is an enlarged cross-sectional view of part of the semiconductor system shown in FIG. 3.

In the first embodiment, four wiring substrates 1a–1d each mounted with a semiconductor chip 5a–5d are stacked as a multi-layered package. The number of wiring substrates 1a–1d is four in this embodiment but not limited to four in the present invention. Two or more substrates can be stacked as required. The multi-layered package includes wiring substrates 1a–1d mounted with semiconductor devices 5a–5d, an uppermost wiring substrate 2 for sealing the package, conductive via insulating boards 3a–3d for holding the semiconductor devices 5a–5d, and a lowermost wiring substrate 4.

In other words, the stacked package is constituted as follows. A plurality of layers each having wiring substrates 1a–1d and conductive via boards 3a–3d are stacked between the uppermost and lowermost wiring substrates 2 and 4. These layers and substrates are formed integrally as one package by heating and pressurization processes. The wiring substrate 1a–1d are each formed of an insulation board, such as a poly-imide substrate and a printed circuit board each covered with copper foil wiring having a thickness of about 40 μm.

Each of the wiring substrates 1a–1d has a plurality of via-holes and connection electrodes 11 are buried in the via-holes of the insulation board or wiring substrate 1a–1d. Copper foils on the wiring substrate 1a–1d are patterned to form lands on the connection electrodes 11 and wires 12 on the substrates and electrically connected to the semiconductor device 5a–5d, respectively. The thickness of the semiconductor devices or chips 5a–5d is about 30 μm to 200 μm, preferably about 50 μm to 150 μm.

The uppermost wiring substrate 2 is formed of an insulation board, such as a poly-imide substrate or a printed circuit board each covered with copper foil wirings having a thickness of about 75 μm. Connection electrodes 21 are buried in via-holes of the insulation board 2. Six conductive layers 10 are formed separately on the entire top surface of the uppermost wiring substrate 2. The conductive layers 10 can be formed using copper foil or by means of sputtering. The layers 10 are selectively connected to any of the connection electrodes 21 buried in the via-holes. The layers 10 may be connected to the electrodes 21A through wires 2A formed on the uppermost wiring substrate 2. The conductive layers 10 and connection electrodes 21A can be connected either directly or through the wires between them.

The conductive via insulation board 3a–3d are each formed of an insulation board, such as a poly-imide substrate and a printed circuit board each covered with copper foil wiring having a thickness of about 75 μm. Connection electrodes 31 are buried in via-holes of the insulation board 3a–3d. A copper foil formed on each of the insulation boards 3a–3d is patterned to have lands as the connection electrodes 31 and wires (not shown) formed on the other area.

For example, a rectangular opening or a cavity 6a is formed in the central part of the insulation board 3a in order to enclose the semiconductor device or chip 5a mounted on the substrate 1a. The width and length of the rectangular opening 6a are set to be larger than those of the semiconductor chip 6a. The remaining substrates 1b–1d are formed in the similar way as the substrate 1a.

The lowermost wiring substrate 4 is formed of an insulation board, such as a poly-imide substrate and a printed circuit board each provided with copper foil having a thickness A of about 75 μm. Connection electrodes 41 are buried in via-holes of the insulation board 4. Six conductive layers 10a and wires 4A are formed on the entire underside of the substrate 4 by patterning the copper foil. The conductive layers 10a are connected to the connection electrodes 41 through the wires 4A formed on the lowermost wiring substrate 4. The layers 10a can be formed using copper foil or by means of sputtering.

FIG. 2 is a perspective view of a stacked package 7 constituting the multi-layered semiconductor device shown in FIG. 1A. As shown in FIGS. 1A and 2, a plurality of (four, in the embodiment) wiring substrates 1a–1d each mounted with a semiconductor device 5a–5d and conductive via insulation boards 3a–3d are stacked one on another, so that the stacked multi-layers are interposed between the uppermost wiring substrate 2 and the lowermost wiring substrate 4. Conductive layers 10 and 10a are formed on the uppermost and lowermost surfaces of the stacked package 7 to serve as external connection terminals.

An external device including a semiconductor system having semiconductor devices as constituting elements, comprises spring terminals 8 formed of flat spring plates which are mounted on a substrate 9 fixed on a base 13 of the external device. The stacked package 7 is fitted or held on the external device such that connection terminals 10 and 10a of the package 7 are pressed by the spring terminals 8 of the external device. Thus, the assembly size in the lateral direction of the stacked package is equal to that of both a package section 7 and a connection terminal section 8. The package 7 can be applied to a semiconductor system such as a portable storage medium for use in small-sized personal computers portable terminals, and voice recorders as shown in the manner of FIG. 3. The surfaces of the external connection terminals 10 and 10a can be plated with gold in order to easily attach and detach the stacked package 7.

As FIG. 7 illustrates, the spring terminals 8 to be referred to as a terminal pin hereinafter contacts the conductive layers 10 and 10a to perform electric connection and to support the stacked package 7. These conductive layers 10 and 10a have the effect of efficiently radiating heat which is generated from the semiconductor devices mounted in the stacked package 7. The conductive layers 10 and 10a are selectively connected to a ground line so as to be used as electric field shielding films or may be used as external terminals. It is desirable that the size of the conductive layers 10 and 10a used as external connection terminals per pin may be designed to have a diameter of 1 mm or more and the area thereof be 1 mm² or larger. At least one of the conductive layers 10 and 10a is employed as a heat radiating layer. It is also desirable that the area of the conductive layers 10 or 10a occupying the uppermost wiring substrate 2 or the lowermost wiring substrate 4 be in a range from 50% to 95% of the whole area of the substrates.

The above-described structure allows a stacked or multi-layered semiconductor device having a thin stacked package to be manufactured. Each of the wiring substrates 1a–1d is interposed between its upper and lower conductive via insulating boards 3a–3d and thus each of the semiconductor device 5a–5d is mounted and enclosed in the package 7 in a hermetically manner. The semiconductor device 5a is enclosed in the cavity 6 formed in the conductive via board 3a, for, example. Since the depth and the area of the cavity 6 are greater than those of the semiconductor device 6a, a space is formed around the semiconductor device 6aby the inner wall of the cavity 6 formed between the uppermost substrate 2 and connection substrate 1a when the semiconductor device 5a is enclosed in the cavity 6.

Even if the stacked semiconductor device 7 is bent and the semiconductor devices 5a–5d therein are also bent slightly, the space formed around the semiconductor devices 5a–5d can prevent the semiconductor devices 5a–5d from being contacted to the upper and lower inner walls of the substrates defining the space. Consequently, even though external force is applied to the stacked semiconductor package 7, the stacked package 7 will not be damaged by the external stress applied from the external force.

Figure 4:
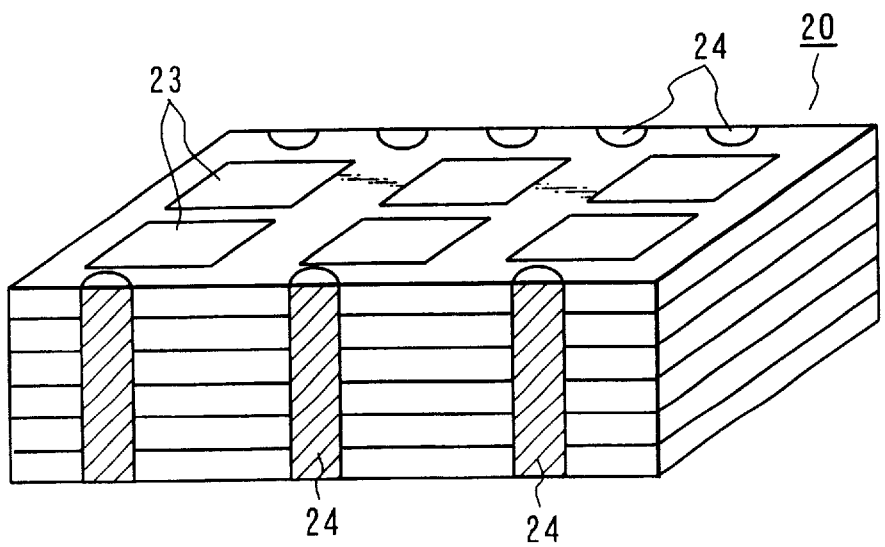
FIG. 4 is perspective view of a semiconductor device according to a second embodiment of the present invention, which is constituted as a stacked package.
Figure 5A:
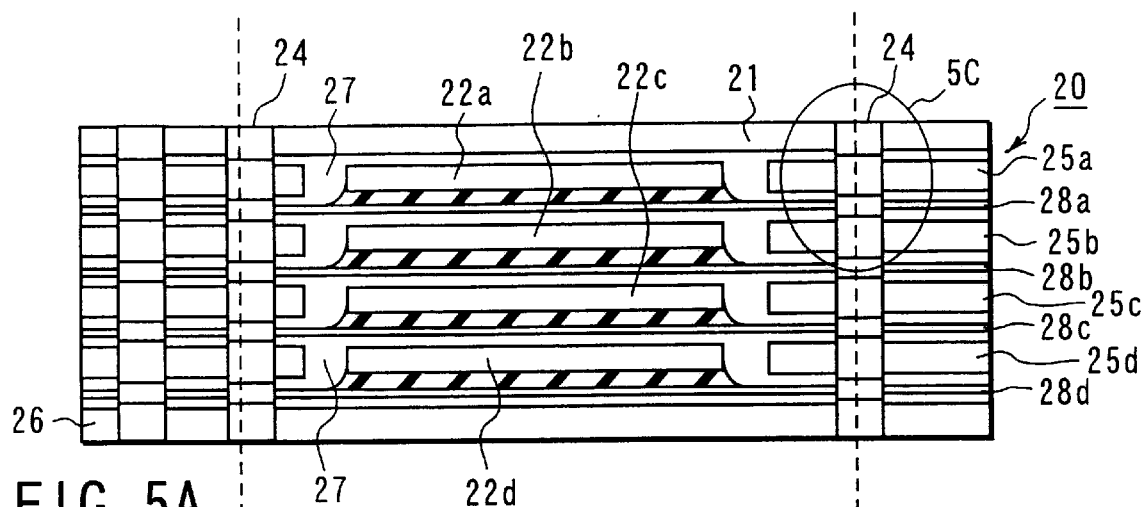
FIGS. 5A and 5B are cross-sectional views depicting a manufacturing process of the semiconductor device illustrated in FIG. 4.
Figure 5B:
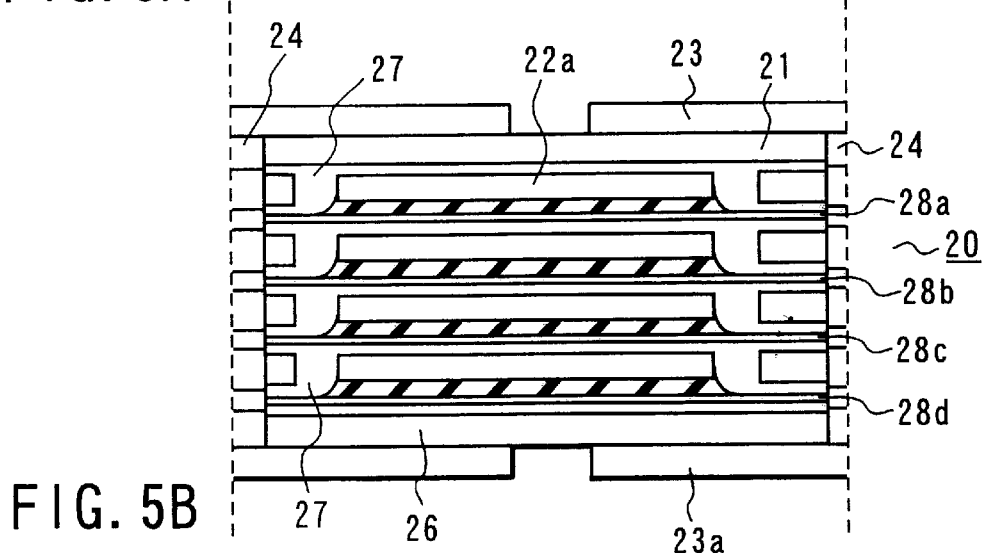
Figure 5C:
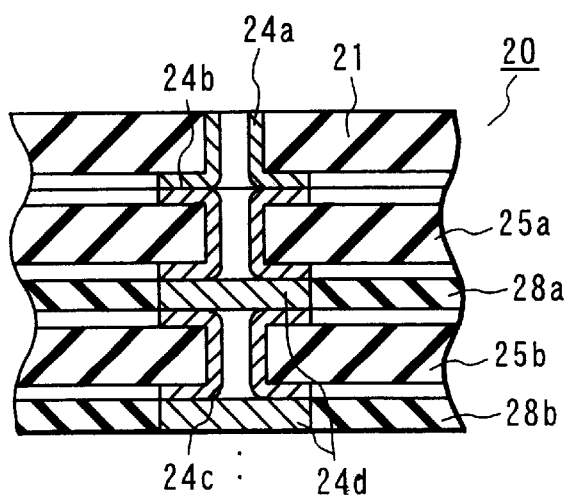
FIG. 5C is an enlarged cross-sectional view showing a detailed stacked structure of a modification corresponding to a part enclosed by a circle 5C in FIG. 5A.
Figure 6:
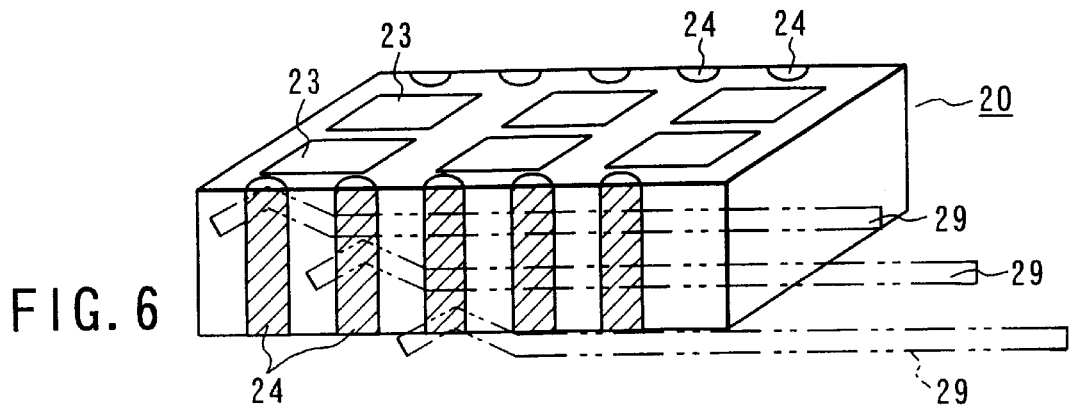
FIG. 6 is a perspective view of the stacked package of the semiconductor device shown in FIG. 4 and terminals thereof for mounting the stacked package on a semiconductor system.

A second embodiment of the present invention will now be described with reference to FIGS. 4 to 6. FIG. 4 is a perspective view of a stacked semiconductor device 20 constituted as a stacked package. FIGS. 5A and 5B are cross-sectional views depicting a manufacturing process of the semiconductor device illustrated in FIG. 4. FIG. 5C shows a modification of the stacked package shown in FIG. 5A. FIG. 6 is a perspective view of the stacked package of the semiconductor device shown in FIG. 4 and spring terminals for mounting the stacked package on a semiconductor system.

A stacked semiconductor device or package 20 of the second embodiment is constituted as follows. As shown in FIG. 5A, four wiring substrates 28a–28d respectively mounted with semiconductor devices 22a–22d and conductive via insulation boards 25a–25d are stacked one on another, and the multi-layered stacked substrates are interposed between the uppermost wiring substrate 21 and the lowermost wiring substrate 26. The semiconductor chip or device 22a, for example, is enclosed in an opening 27 of the conductive via insulation board 25a.

The stacked package 20 has conductive,layers 23, 23a formed on the wiring substrates 21 and 26, respectively, and connection electrodes 24 are buried in the via-holes formed in the respective substrates 21, 28a–28d and 26, and via-holes formed in the respective boards 25a–25d so as to expose the upper and lower ends thereof at the top surface of the substrate 21 and the underside surface of the substrate 26. Some of the connection electrodes 24 are electrically connected to the conductive layers 23 or 23a as shown in FIG. 5B. The connection electrodes 24 are selectively connected to the semiconductor chips 22a–22d.

In this second embodiment, the connection electrodes buried in the via-holes are cut vertically by a cutting plane as shown in FIGS. 5A and 5B, and thus cutting surfaces of the connection electrodes 24 are exposed from the side of the package 20 as shown in FIG. 4 or 6.

Therefore, the conductive layers 23 and 23a serve as external terminals for electrically connecting the layers 23 and 23a to pins of an external device in a semiconductor system. The connection electrodes 24 also serve as external terminals since they are exposed to the outside of the semiconductor package 20.

When the connection electrodes 24 serve as external terminals, the package 20 may be supported with the electrodes 24 formed both sides of the package 20 being pressed by spring terminals 29 as shown in FIG. 6. When conductive layers 23 and 23a serve as external terminals, the package 20 is sandwiched between pins or spring terminals 29 of an external device in the similar manner as shown in FIG. 7 so that the package 20 is supported by the spring terminals 29 as shown in FIG. 6 or 7.

In the case of FIG. 6, the conductive layers 23 and 23a are not used as connection terminals, so that they need not be connected to the connection electrodes 24 but connected to connection electrodes connected to a ground line (not shown) as required to make the layers 23 and 23a act as electric field shield electrodes to obtain the shield effect.

A semiconductor system including external devices having semiconductor devices, comprises spring terminals formed by flat spring plates mounted on a substrate alongside the system as shown in FIGS. 3, 6 and 7, for example. In the case of FIG. 6, the stacked package 20 is fixed by flat spring terminals (pins) 28 such that its external terminals 24 are pressed by the flat spring terminals 29. The size of the whole stacked package module is equal to that of both a package mounting section including the package 20 and connection terminal section including the spring terminals 29. The package 20 can be applied to a semiconductor system such as a portable storage medium for use in small-sized personal computers, portable terminals, and voice recorders. The surfaces of the external terminals 23, 23a and 24 can be plated with hard gold in order to easily attach and detach the package 20 with respect to the system terminals 28.

A method of manufacturing a stacked package according to the second embodiment of the present invention will now be described with reference to FIGS. 5A and 5B.

The stacked package 20 comprises wiring substrates 28a–28d mounted with semiconductor devices 22a–22d, respectively, the uppermost wiring substrate 21 for sealing the package, conductive via insulation boards 25a–25d having openings 27 for enclosing the semiconductor devices 22a–22d, and the lowermost wiring substrate 26.

In other words, the package 20 is constituted as follows. A plurality of stacked layers including conductive via boards 25a–25d and wiring substrates 28a–28d are stacked between the uppermost and lowermost wiring substrates 21 and 26. These layers are formed integrally as one package through heating and pressurization processes. The wiring substrate 28a–28d are each formed of an insulation board, such as a poly-imide substrate or a printed circuit. board each covered with copper foil having a thickness of about 40 $\mu$m. Common connection electrodes 24 are formed in the layer stacking direction such that they are buried into the via-holes of the stacked wiring substrates 28a–28d and conductive via insulation boards 25a–25d. The connection electrodes 24 are electrically connected to the semiconductor devices 22a–22d through wires formed on the wiring substrates 28a–28d and the insulation boards 25a–25d as shown in FIGS. 5A and 5B.

In order to shape the stacked layers along the target outside shape of the package 20, they are cut with a blade, a router or the like along the axis of the aligned via-holes or the axis of the connection electrodes 24, and the electrodes 24 are exposed to the side of the stacked package 20 as shown in FIG. 4. Then, conductive layers 23 and 23a are formed on both surfaces of the stacked layers 21 and 26 and connected to the connection electrodes 24 as shown in FIG. 5B. The via-holes for interlayer connection between the wiring substrates 28a–28d and conductive via insulation boards 25a–25d are filled with conductive resin paste containing a silver or copper filler, copper, or silver as the connection electrodes or connection plugs. The via-holes are formed as through-holes using a drill.

In the second embodiment, the via-holes filled with conductive material are cut, and the connection electrodes buried therein are exposed to the side of the stacked package 20. The heat radiation characteristic of the package 20 is therefore improved further.

The terminals 29 of an external device can be used to support mechanically via the connection electrodes 24 the stacked package 20 and thus the means for supporting the package 20 is increased in number. No external terminal is formed on the top and bottom surfaces of the package 20. Accordingly, the stacked semiconductor package can be thinned further.

In the embodiment of FIGS. 4 and 6, the connection electrodes 24 are formed by fully burying conductive material into via-holes formed in the respective stacked layers including substrates 28a–28d and boards 25a–25d. According to the present invention, the connection electrodes can be formed in a different manner. FIG. 5C shows one example of the different structure of the connection electrodes. FIG. 5C shows a part of the stacked package corresponding to that enclosed by the circle 5C in the embodiment of FIG. 5A. In the case of FIG. 5C, via-holes are previously formed in the respective layers 21, 26a, 28a, 25b and 28b, before these layers are stacked in the manner of FIG. 5C. The inner wall and the peripheral portion around the under side of the via-hole formed in the uppermost substrate 21 are covered with a conductive film 24a. In the similar way, the inner walls and the peripheral portions around the upper and under sides of the via-holes formed in the insulation boards 25a and 25b are covered with conductive films 24b and 24c as shown in the figure. In the case of the wiring substrates 28a and 28b, the via-holes formed therein are filled with conductive materials 24d.

When the layers with the conductive films and materials 24a–24d are stacked as shown in the figure, they are connected electrically with each other in a similar manner as in the foregoing embodiments.

The above-described structure allows a stacked semiconductor device to be manufactured as a thin stacked package. A wiring substrate is interposed between upper and lower conductive via insulation boards each having a hole and thus the semiconductor device mounted on the wiring substrate can be enclosed in a cavity formed by the hole and is hermetically held therein. Thus, the semiconductor device is hermetically enclosed in the cavity of the conductive via insulation board. Since the depth and the area of the cavity are greater than the size of the semiconductor device, a space is formed between the semiconductor device and the inner wall of the cavity when the semiconductor device is held in the cavity.

Therefore, even if the stacked semiconductor device is bent and the semiconductor devices therein are bent and expanded slightly, the space can absorb the expansion or deformation of the semiconductor devices and no electrical and mechanical damage will be applied thereto. Consequently, even though external force is applied to the semiconductor devices, the stacked package can absorb stresses generated from the external force.

Figure 8:
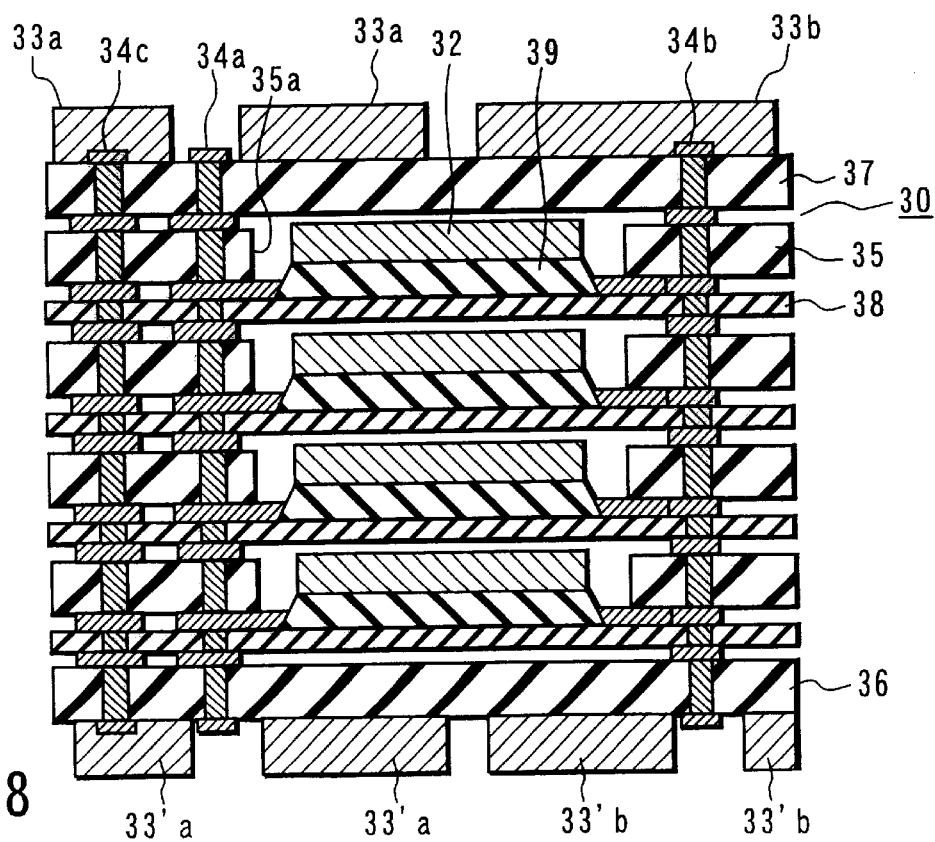
FIG. 8 is a ross-sectional view of a stacked semiconductor of device according to a third embodiment of the present invention.

A stacked semiconductor device according to a third embodiment of the present invention will now be described with reference to FIG. 8. FIG. 8 is a cross-sectional view of the stacked semiconductor device. In the third embodiment, conductive layers 33a, 33a', 33b and 33b' formed on the top and bottom surfaces of a stacked package 30 are used as electric field shielding films. The stacked semiconductor device shown in FIG. 8 is arranged as a multi-layered stacked package 30. The stacked package 30 includes a plurality of wiring substrates 38 each mounted with a semiconductor device 32 and a plurality of conductive via boards 35 each having an opening or a cavity 35a for enclosing the semiconductor device 32. The conductive via boards 35 and wiring substrates 38 are stacked alternately to obtain a stacked structure of the stacked semiconductor device 30. In the third embodiment, for example, four semiconductor devices 32 are mounted to constitute a stacked semiconductor device. The stacked semiconductor device is interposed between an uppermost wiring substrate 37 and a lowermost wiring substrate 36 to seal the semiconductor devices 32. In the stacked layer structure, connection electrodes 34a, 34b and 34c connected to the semiconductor devices 32 through pads, are formed in the via-holes formed in the stacked layers. The connection electrodes 34a and 34b are provided respectively as signal lines, while the connection electrode 34c is provided as a ground line being grounded when the package 30 is inserted to an external system. The plurality of conductive layers 33a, 33b, 33'a and 33'b, which are made of metal such as aluminum or copper, for example, are formed on the uppermost and lowermost wiring substrates 37 and 36.

The conductive layers are formed by sputtering or of metal foil. The conductive layers 33a and 33'a are electrically connected to the ground line 34c but are not contacted with the signal lines 34a an d 34b. The conductive layers 33a and 33'a are thus connected to the ground line 34c to obtain a shield effect.

The shield effect can be controlled by selecting the material and thickness of the conductive layers and the material and width of the connection electrodes appropriately. The conductive layer 33b is used as an external connection terminal that is electrically connected to the signal line 34b. The conductive layers improve the heat radiation effect of the stacked package 30. In the third embodiment of FIG. 8, the via-holes formed in the substrates 38 and board 35 are buried with conductive materials and connection electrodes are made from upper side to the lower side of the stacked package 30 in the similar manner as in the case of FIGS. 4 and 6.

Figure 9:
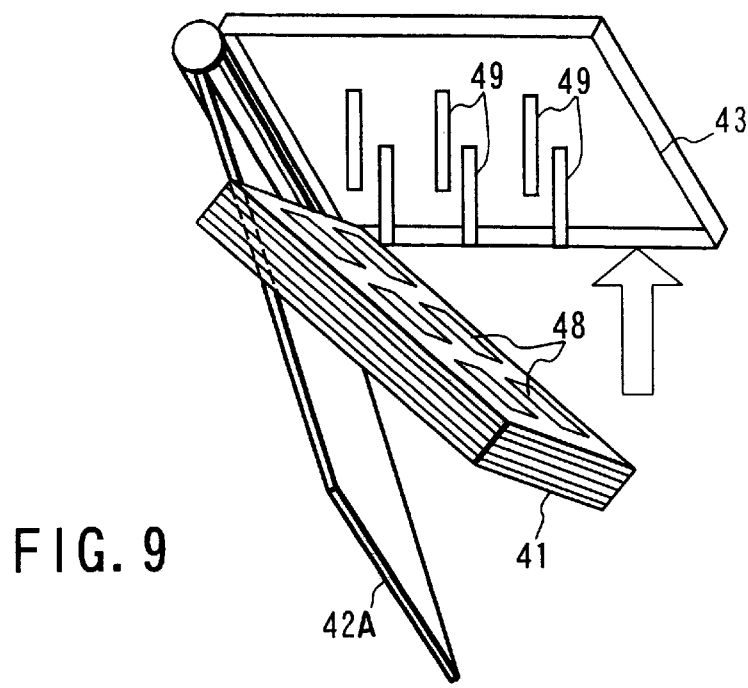
FIG. 9 is a perspective view showing a terminal box of an external semiconductor system and a package of a stacked semiconductor device according to a fourth embodiment of the present invention.
Figure 10:
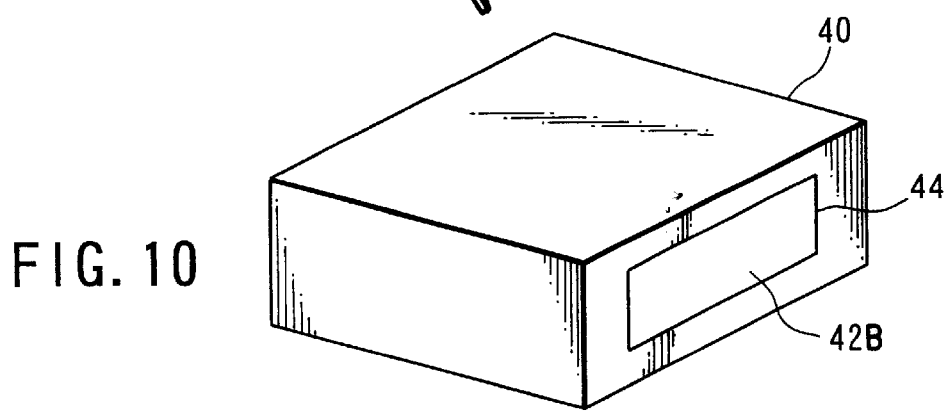
FIG. 10 is perspective view of the external semiconductor system on which the stacked semiconductor device of the present invention is mounted.
Figure 11A:
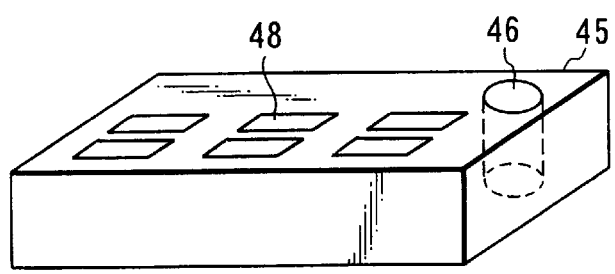
FIGS. 11A and 11B are perspective views showing another example of the stacked package to be inserted in the external semiconductor system illustrated in FIG. 10.
Figure 11B:
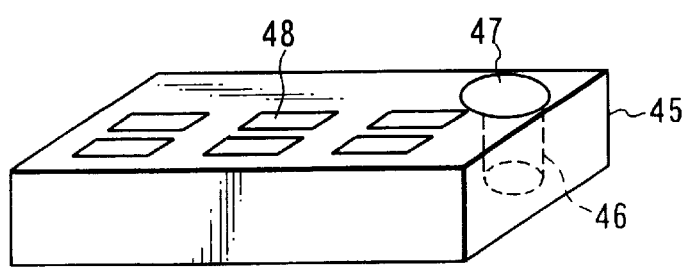
Figure 12A:
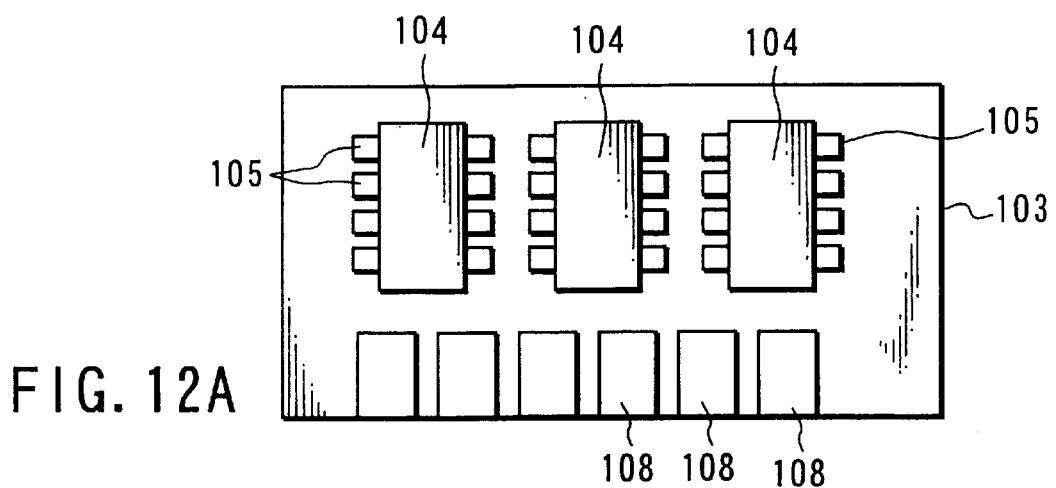
FIGS. 12A and 12B are a plan view and a cross-sectional view prior art semiconductor package.
Figures 12B, 13B:
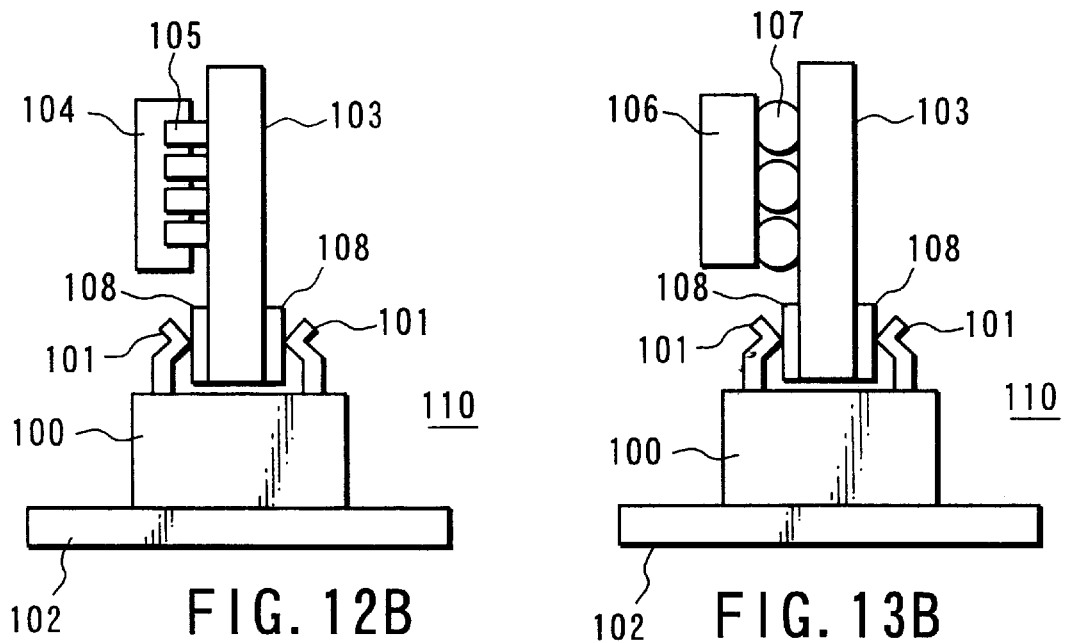
FIGS. 13A and 13B are a plan view and a cross-sectional view of another prior art semiconductor package.
Figure 13A:
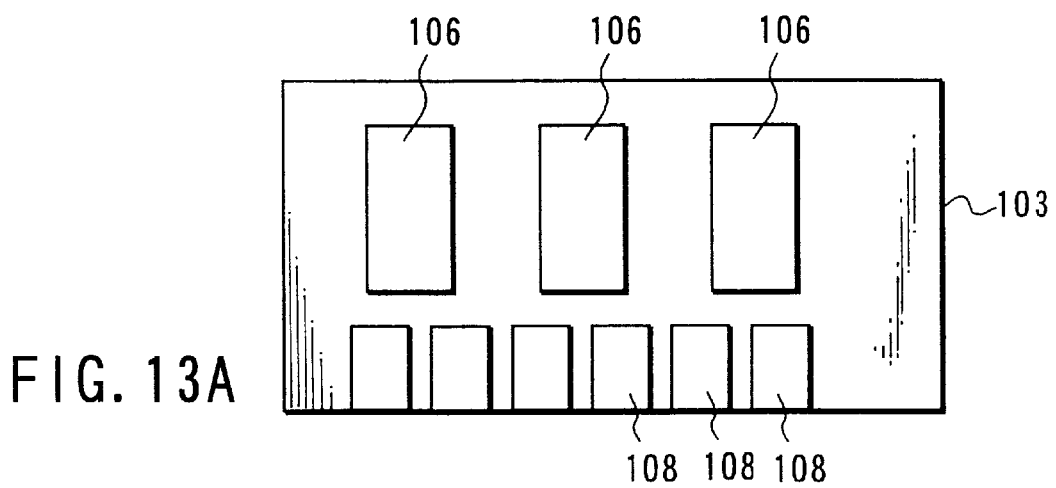

A fourth embodiment of the present invention will now be described with reference to FIGS. 9 to 11B. FIG. 9 is a perspective view showing a terminal box of an external device and a stacked package, FIG. 10 is a perspective view of another external device, FIGS. 11A and 11B are perspective views showing examples of the stacked package to be inserted in the external device of FIG. 10. The fourth embodiment is characterized in that the stacked package according to the first to third embodiments is attached to the terminals of an external device. The size of the whole stacked package is equal to that of both a package mounting section and a connection terminal section. The package can easily be applied to an external device constituting a semiconductor system such as a portable storage medium for use in small-sized personal computers, portable terminals, and voice recorders.

As FIG. 9 shows, a terminal box of an external device has a lid 42A and a terminal box 43 in/from which a card-like stacked package 41 can be inserted/removed. The external device is a semiconductor system of the present invention. When the lid 42A is opened and the package 41 is inserted in the terminal box 43, external terminals 48 of the stacked package 41 contact to flat spring terminals 49 provided on a bottom wall of the terminal box 43 formed in the external device. When the package 41 is held in the terminal box 43 by the lid 42A, both the external device and the stacked package 41 thus electrically contact each other.

FIGS. 11A and 11B are perspective views showing a card-like stacked package 45 having a through-hole 46. When the stacked package 45 is being inserted in the opening 44 of the external device 40 shown in FIG. 10, the through-hole 46 is covered with a seal 47 as shown in FIG. 11B. In this case, the external device 40 is provided with a system for sensing the through-hole 46, such as a device for emitting and detecting a pin or a light beam passing through the through-hole 46. When the pin or beam is blocked by the seal 47, a memory mounted in the semiconductor device 45 cannot be used to read or write data. The use of such a stacked package 45 allows the memory to read/write data and stop reading/writing data when necessary. In the fourth embodiment, the stacked package 45 can be inserted and removed in the similar manner as a cassette tape which is slotted into a cassette deck and thus its operation is very easy to perform.

The use of the stacked semiconductor device and the system mounted with the stacked semiconductor device have been achieved in order to develop a semiconductor device which is increased in density and decreased in thickness and thus used widely in IC cards and cellular phones. The stacked semiconductor device has a thin stacked package which is suitable for a thin stacked semiconductor device having a thickness of about 30 μm to 200 μm. The stacked semiconductor device is thin, high in heat radiation, excellent in shield effect, and easy to attach/detach to/from an external device.

Additional advantages and modifications will readily occur to those skilled in the art.; Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A stacked semiconductor device comprising:
   a plurality of stacked wiring substrates each including a plurality of via-holes in which first connection electrodes are formed and first wires electrically are connected to the first connection electrodes;
   an uppermost wiring substrate stacked on a top of the stacked wiring substrates and including a plurality of via-holes in which second connection electrodes are formed and second wires are electrically connected to the second connection electrodes;
   a plurality of semiconductor devices mounted on the respective wiring substrates and electrically connected to the first wires thereof,
   a plurality of conductive via insulation substrates each having a cavity which is larger than the semiconductor device enclosed therein and each including a plurality of via-holes in which third connection electrodes are formed, one of the conductive via insulation substrates being stacked on one of the stacked wiring substrates; and
   a plurality of conductive layers formed on a top surface of the uppermost wiring substrate and/or a bottom surface of a lowermost wiring substrate formed under the stacked wiring substrates,
   wherein an area of said plurality of conductive layers occupying at least one surface of said uppermost and lowermost wiring substrates ranges from 50% to 95%.

2. The stacked semiconductor device according to claim 1, wherein the conductive layers are used as external connection terminals.

3. The stacked semiconductor device according to claim 2, wherein the external connection terminals each has a diameter of 1 mm or more and an area of 1 mm² or larger.

4. The stacked semiconductor device according to claim 3, wherein at least one of the connection electrodes of the wiring substrates, the uppermost wiring substrate, and the conductive via insulation substrates is connected to a ground line, and at least one of the conductive layers is electrically connected to the ground line through the connection electrodes.

5. The stacked semiconductor device according to claim 3, wherein at least one of the conductive layers serves as a heat radiation layer.

6. The stacked semiconductor device according to claim 2, wherein at least one of the connection electrodes of the wiring substrates, the uppermost wiring substrate, and the conductive via insulation substrates is connected to a ground line, and at least one of the conductive layers is electrically connected to the ground line through the connection electrodes.

7. The stacked semiconductor device according to claim 2, wherein at least one of the conductive layers serves as a heat radiation layer.

8. The stacked semiconductor device according to claim 1, wherein at least one of the connection electrodes of the wiring substrates, the uppermost wiring substrate, and the conductive via insulation substrates is connected to a ground line, and at least one of the conductive layers is electrically connected to the ground line through the connection electrodes.

9. The stacked semiconductor device according to claim 4, wherein at least one of the conductive layers serves as a heat radiation layer.

10. The stacked semiconductor device according to claim 8, wherein the connection electrodes formed in the via-holes of the wiring substrates, the uppermost wiring substrate, and the conductive via insulation substrates are exposed to side walls of the stacked semiconductor device.

11. The stacked semiconductor device according to claim 8, wherein each of the semiconductor device has a thickness of 30 $\mu$m to 200 $\mu$m.

12. The stacked semiconductor device according to claim 1, wherein at least one of the conductive layers serves as a heat radiation layer.

13. The stacked semiconductor device according to claim 1, wherein the connection electrodes formed in the via-holes of the wiring substrates, the uppermost wiring substrate, and the conductive via insulation substrates are exposed to side walls of the stacked semiconductor device.

14. The stacked semiconductor device according to claim 13, wherein the connection electrodes exposed to the side walls of the stacked semiconductor device serve as external connection terminals.

15. The stacked semiconductor device according to claim 1, wherein each of the semiconductor device has a thickness of 30 $\mu$m to 200 $\mu$m.

16. The stacked semiconductor device according to claim 1, wherein said plurality of stacked wiring substrates constitute a stacked package, and each of said first connection electrodes formed in said via-holes formed in said plurality of stacked wiring substrates has a cutting surface exposed from at least one side wall of said stacked package.

17. A stacked semiconductor system comprising a module substrate having spring terminals which hold a stacked semiconductor device having external connection terminals,
   wherein the external connection terminals are pressed by the spring terminals, and
   wherein said stacked semiconductor device comprises:
   a plurality of stacked wiring substrates each including a plurality of via-holes in which first connection electrodes are formed and first wires are electrically connected to the first connection electrodes;
   an uppermost wiring substrate stacked on a top of the stacked wiring substrates and including a plurality of via-holes in which second connection electrodes are formed and second wires electrically are connected to the second connection electrodes;
   a plurality of semiconductor devices mounted on the respective wiring substrates and electrically connected to the first wires thereof;
   a plurality of conductive via insulation substrates each having a cavity which is larger than the semiconductor device enclosed therein and each including a plurality of via-holes in which third connection electrodes are formed, one of the conductive via insulation substrates being stacked on one of the stacked wiring substrates; and
   a plurality of conductive layers formed on a top surface of the uppermost wiring substrate and/or a bottom surface of a lowermost wiring substrate formed under the stacked wiring substrates,
   wherein an area of said plurality of conductive layers occupying at least one surface of said uppermost and lowermost wiring substrates ranges from 50% to 95%.

18. A stacked semiconductor system according to claim 17, wherein at least one of the spring terminals is connected to a ground line.

19. The stacked semiconductor device according to claim 17 wherein said plurality of stacked wiring substrates constitute a stacked package, and each of said first connection electrodes formed in said via-holes formed in said plurality of stacked wiring substrates has a cutting surface exposed from at least one side wall of said stacked package.

* * * * *